US006815281B1

United States Patent
Inoue et al.

(10) Patent No.: US 6,815,281 B1
(45) Date of Patent: Nov. 9, 2004

(54) METHOD OF MANUFACTURING A SEMICONDUCTOR DEVICE HAVING A MEMORY CELL SECTION AND AN ADJACENT CIRCUIT SECTION

(75) Inventors: Ken Inoue, Tokyo (JP); Masayuki Hamada, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 23 days.

(21) Appl. No.: 09/667,706

(22) Filed: Sep. 22, 2000

(30) Foreign Application Priority Data

Oct. 27, 1999 (JP) ............................................. 11/305702

(51) Int. Cl.[7] ........................................ H01L 21/8238
(52) U.S. Cl. ...................................... 438/200; 438/199
(58) Field of Search ................................ 438/199, 200, 438/218, 221, 225, 220, 230, 231, 232, 233, 239

(56) References Cited

U.S. PATENT DOCUMENTS

| | | | |
|---|---|---|---|
| 5,981,324 A | * 11/1999 | Seo et al. | 438/210 |
| 6,107,154 A | * 8/2000 | Lin | 438/396 |
| 6,117,723 A | 9/2000 | Huang | |
| 6,150,248 A | * 11/2000 | Sekiguchi et al. | 438/592 |
| 6,190,957 B1 | * 2/2001 | Mochizuki et al. | 438/240 |
| 6,200,834 B1 | * 3/2001 | Bronner et al. | 438/142 |
| 6,214,676 B1 | * 4/2001 | Jun et al. | 438/279 |
| 6,300,206 B1 | * 10/2001 | Fukada et al. | 438/303 |
| 6,303,432 B1 | * 10/2001 | Horita et al. | 438/253 |
| 6,436,753 B1 | * 8/2002 | Ikeda et al. | 438/238 |
| 6,579,784 B1 | * 6/2003 | Huang | 438/595 |
| 2002/0004303 A1 | * 1/2002 | Agnello et al. | 438/689 |

FOREIGN PATENT DOCUMENTS

| | | |
|---|---|---|
| JP | 04-032260 | 2/1992 |
| JP | 09-153595 | 6/1997 |
| JP | 10-335480 | 12/1998 |
| JP | 11-17129 | 1/1999 |
| JP | 11-008361 | 1/1999 |
| JP | 11-017129 | 1/1999 |
| JP | 11-97649 | 4/1999 |
| JP | 11-111974 | 4/1999 |
| JP | 2001-057347 | 2/2001 |
| KR | 10-0190108 | 1/1999 |

OTHER PUBLICATIONS

S. Wolf. et al. Silicon Processing for the VLSI Era. 1986. Lattice Press. vol. 1., pp. 308 and 309.*

* cited by examiner

Primary Examiner—Ori Nadav
Assistant Examiner—Douglas W Owens
(74) Attorney, Agent, or Firm—McGinn & Gibb, PLLC

(57) ABSTRACT

In a DRAM-incorporated semiconductor device (SOC) which has a DRAM section and a logic section being formed on one and the same substrate, with the object of providing, with low cost, a SOC having necessary and sufficient characteristics in the DRAM section, while attaining higher-speed performance of the whole elements, silicide is formed at least on all the surfaces of the source-drain regions (10) and the gate surfaces (6) of transistors in the DRAM section and the logic section, concurrently in one and the same step.

6 Claims, 6 Drawing Sheets

METHOD OF MANUFACTURING A SEMICONDUCTOR DEVICE HAVING A MEMORY CELL SECTION AND AN ADJACENT CIRCUIT SECTION

BACKGROUND OF THE INVENTION

1. Field of the Invention

The present invention relates to a semiconductor device and a manufacturing method thereof and more particularly to an improvement on a SOC (System On Chip) that has a logic (logic circuit) and a DRAM (Dynamic Random Access Memory) together on one and the same substrate.

2. Description of the Related Art

In a general purpose DRAM (having, on one chip, only a memory section and an adjacent circuit section which comprises a decoder, a sense amplifier, an I/O (input/output) circuit and the like), hold characteristics of memory cells have been, hitherto, regarded as the matter of great importance so that it has become a common practice to set the dopant concentration in the source-drain regions of cell transistors lower than that in the adjacent circuit section for the purpose of achieving the suppression of the junction leakage current.

Meanwhile, in recent years, demands that image processing using computer graphics should be made at a higher speed have been growing. Accordingly, there has been proposed a DRAM-incorporated logic chip as shown in FIG. 9, a so-called SOC 31 which has a DRAM section 32 comprising memory cells 33 and adjacent circuits 34 such as a decoder and a sense amplifier, a logical operation section (a logic section) 35 where graphic processing is carried out at a high speed, and, in addition, an I/O section 36 which connects these DRAM and logic sections with an external circuit, all together on one chip.

In the DRAM section thereof, to suppress the short channel effect and relax the centralization of the drain field, the dopant concentration in the source-drain (S/D) should be, hitherto, set low. This makes the junction in the S/D regions C shallow and, as has been pointed out, the silicidation therein may bring about an increase in the leakage current. In light ail of this problem, several techniques of making silicidation in the DRAM section have been proposed For example, Japanese Patent Application Laid-open No. 97649/1999 discloses the methods using the following SOC structures: that is, (1) a structure (first embodiment) wherein, while the dopant concentration in S/D regions of a memory cell region in a DRAM section is set low to make the leakage small, dopants are implanted into S/D regions of an adjacent circuit region to a high concentration, and besides silicide layers are formed on gate surfaces and the surfaces of active regions, and thereby high-speed operations become attainable; (2) a structure (second embodiment) wherein, in DRAM cell section, S/D regions (low dopant-concentration regions) with which capacitor contacts are connected are set as non-silicide regions, and silicide layers are formed only on the surfaces of S/D regions (low dopant-concentration regions) with which bit line contacts are connected and on the gate surfaces of cell transistors, whereby the interconnection resistance and the contact resistance are reduced, and reading and writing operations at a higher speed are made attainable; and (3) a structure. (third embodiment) wherein, in a DRAM memory cell section, portions of a TEOS (Tetra-Ethyl-Ortho-Silicate) oxide film that is first laid at the time of formation of transistor sidewalls are selectively left at the edge of LOCOS (Local Oxidation of Silicon), or in the vicinity of bird's beaks, and thereafter silicide layers are formed on the entire surface of the DRAM memory cell section but said portions, in the same way as for cell gates and a logic section, and thereby reading and writing operations at a higher speed are made attainable, while the junction leakage is kept low. As an example, the third embodiment in said publication is now described in detail with reference to a schematic cross-sectional view of a memory cell section shown in FIG. 10. A semiconductor substrate 41 is isolated into elements by isolation oxide films 42 and a memory cell transistor is formed between these films. Silicide layers 49 are formed on the surfaces of the gate electrodes 48 and in regions where a contact 52a connecting with a bit line 51 and contacts 52b connecting with storage nodes 53 are in contact with the semiconductor substrate 41, respectively. These silicide layers lying on the substrate are formed within low dopant-concentration regions 47. At the edge sections of the isolation oxide films 42, there are formed TEOS oxide films 50, protecting these edge sections from silicidation, so that silicide layers may not be formed beneath the isolation oxide films 42 or the junction leakage may not be generated around the edges thereof. In the drawing, 43–45 each represents an interlayer insulating film; 46, gate oxide films; 54, a dielectric film and 55, a cell plate.

Further, Japanese Patent Application Laid-open No. 17129/1999 discloses a structure wherein, after S/D regions of transistors in a DRAM cell section and a logic section are formed in separate steps, respectively, and contact-holes that reach S/D regions of transistors for cell selection are formed, silicide layers are formed on the surfaces of the S/D regions through said contact-holes so that conductive films are buried in the contact-holes. In this instance, silicide layers are also formed in the S/D regions of transistors in the logic section but this silicidation is carried out in a different step from the one for silicidation of the S/D regions of transistors for cell selection. Further, it is therein mentioned that silicidation can be also applied to the gate surfaces in another step.

In any of these conventional techniques, the S/D regions of DRAM cell transistors are still formed to have a low dopant concentration, while the S/D regions of transistors in the logic section, a high dopant concentration. In other words, a SOC structure of this sort is designed under the concept that a high-speed logic is made incorporated into an existing DRAM. This assumes fabrication of the DRAM section and the logic section in separate steps and, thus, a reduction of the production cost cannot be much expected to happen. However, the SOC is, by, nature, designed and manufactured for each system application. In comparison with the general purpose DRAM, a small quantity and a large diversity characterize its production, and, therefore, the cost reduction has a particular significance.

SUMMARY OF THE INVENTION

An object of the present invention is, therefore, with such a pre-concept relinquished, to provide a manufacturing method that can produce, with low cost, an SOC having necessary and sufficient characteristics in the DRAM section, while attaining higher-speed performance of the whole elements therein, on the basis of a novel concept that a DRAM is made incorporated into a high-speed logic, and a structure of the SOC thereat.

Accordingly, the present invention relates to a DRAM-incorporated semiconductor device which has a DRAM section and a logic section being formed on one and the same substrate, wherein silicide layers are formed, at least, on z all the surfaces of the source-drain regions and the gate surfaces of transistors in the DRAM section and the logic section. Further, the present invention relates to a method of manufacturing a DRAM-incorporated semiconductor device in which a DRAM section and a logic section are formed on a semiconductor substrate that is isolated into elements, wherein silicidation of all the surfaces of the source-drain regions and the gate surfaces that constitute transistors in the DRAM section and the logic section is carried out concurrently in one and the same step.

Further, the present invention relates to a semiconductor device having a memory cell section and an adjacent circuit section, wherein silicide layers are formed on all the surfaces of the source-drain regions and the gate surfaces of transistors in the memory cell section and the adjacent circuit section.

In the present invention, the source-drain regions in the DRAM section are made high dopant-concentration regions and consequently, through silicidation of all the surfaces of said regions and the gate surfaces, good ohmic contacts can be formed. Further, the formation of silicide can be carried out concurrently with silicidation in the logic section in one and the same step. Therefore, an increase in the number of the steps in a manufacturing method can be avoided, and both higher-speed performance of the whole elements and lower cost production can be realized.

DETAILED DESCRIPTION OF THE PREFERRED EMBODIMENTS

Figure 1:
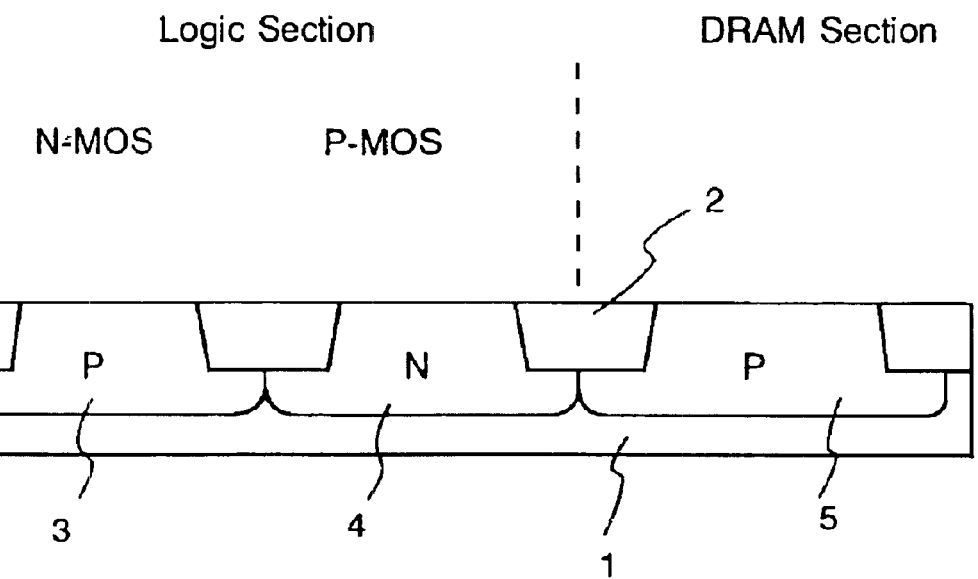
FIGS. 1–8 are a series of schematic cross-sectional views illustrating the steps of a manufacturing method of a semiconductor device that is one embodiment of the present invention.

Referring to the drawings, the present invention is described in detail below. FIGS. 1–8 are a series of schematic cross-sectional views illustrating the steps of a manufacturing method of a semiconductor device that is one embodiment of the present invention.

First, onto a Si substrate 1, buried oxide films 2 are formed by the known method of trench isolation so as to isolate an N-MOS (N-Metal-Oxide-Semiconductor) and a P-MOS of a logic section and a DRAM section each as an element. Next, over the surface of the substrate 1, a thin oxide film (a $SiO_2$: sacrifice oxide film, not shown in the drawing) is formed by thermal oxidation, and then the channel ion implantation for forming P-channels and N-channels to the logic section and adjacent circuits which comprise a decoder and a sense amplifier in the DRAM section, an I/O circuit and the like, and forming N-channels to memory cells, together with the ion implantation for forming respective wells (a P-well 3, an N-well 4 and a cell P-well 5) are performed. This accomplishes formation of the structure shown in FIG. 1. Although FIG. 1 shows, for the sake of simplification, only respective wells, buried oxide films 2 for element isolation and a memory cell in the DRAM section, it is apparent that the present invention is not limited to this structure. Further, the ion implantation for the cell P-well 5 and the P-well 3 may be performed simultaneously or separately. A deep N-well may be additionally formed in the memory cell region.

Figure 2:
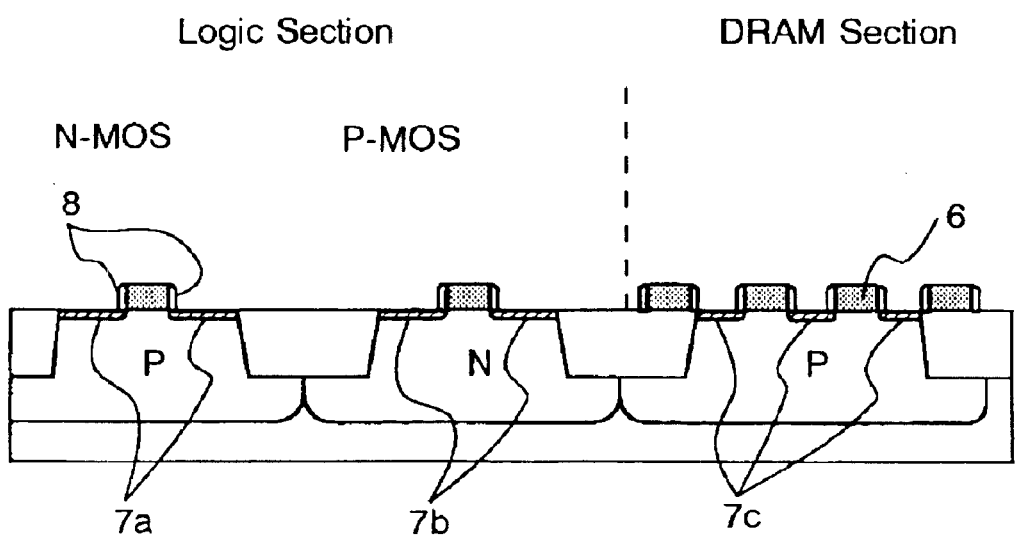

After removing the sacrifice oxide film, a gate oxide film (not shown in the drawing) is formed by another thermal oxidation. Hereat, it is preferable to make the gate oxide film thicker in the DRAM section than in the logic section. A polysilicon layer that is to serve as respective gates of all transistors is, then, formed over the entire surface and patterned into a prescribed shape of gate electrodes. After that, dopant ions are implanted thereinto so as to form LDD (Lightly-Doped Drain) regions 7a, 7b and 7c, in respective sections. Formation of the LDD regions 7a and 7c may be performed, hereat, simultaneously or separately. Subsequently, using TEOS or the like, an oxide film is grown over the entire surface by the CVD (Chemical Vapour Deposition) method and, through anisotropic etching, LDD sidewalls 8 are formed on lateral faces of gate electrodes (FIG. 2).

Figure 3:
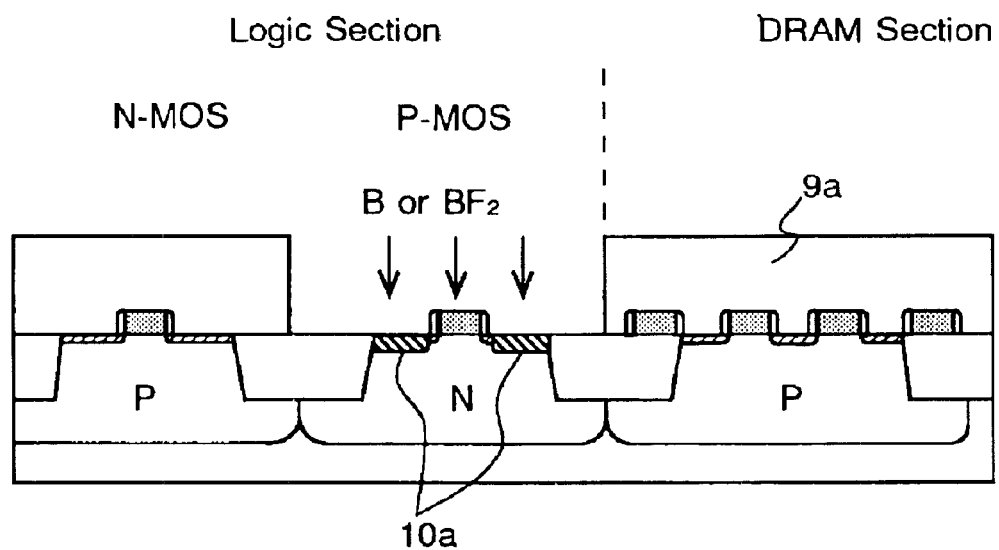

Next, as shown in FIG. 3, masking the N-MOS section and the DRAM section with a resist 9a, only the P-MOS section is left exposed, and p-type dopants such as B or $BF_2$ are ion-implanted for formation of the S/D regions boa in the P-MOS section. For example, $BF_2$ is ion-implanted under the conditions that the accelerating voltage is 20 keV and the dose is 3E15 or so. Hereat, the gate polysilicon is also subjected to the ion implantation simultaneously and, as a result, becomes a P-gate.

Figure 4:
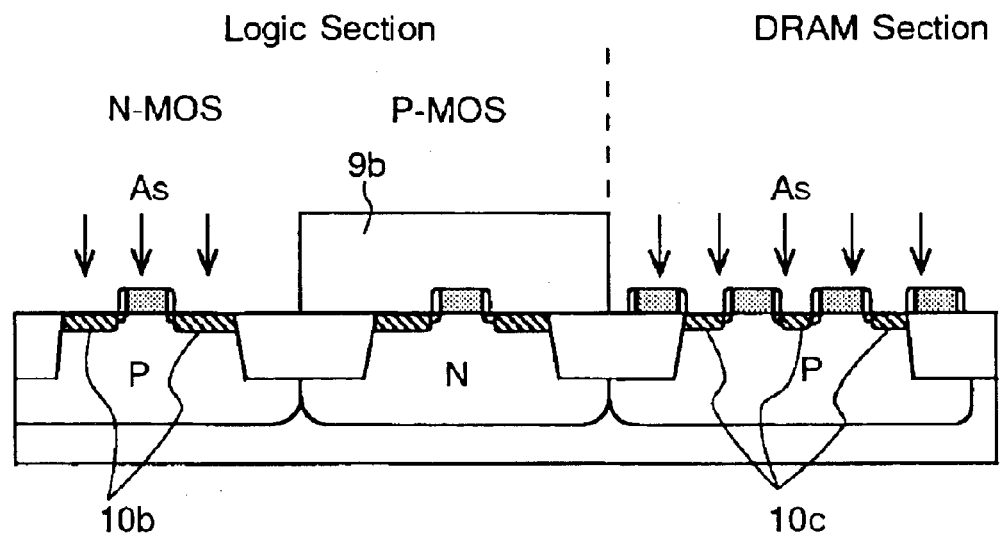

Next, as shown in FIG. 4, a resist 9b is formed only in the P-MOS section, and n-type dopants such as P or As are ion-implanted into the N-MOS section and the DRAM section, for example, As is ion-implanted at 50 kev to a dose of 3E15–6E15 or so, thus forming S/D regions 10b and 10c, respectively. Hereat, the gate polysilicons are also subjected to the ion implantation simultaneously and, as a result, become N-gates. In effect, there are formed so-called P-N gates in which the P-ch has a P-gate and the N-ch, an N-gate. After that, for example, the RTA (Rapid Thermal Annealing) (ramp annealing) is performed at 1000 (C for 10 seconds or so, and the implanted dopants are activated. While ion-implantation is, hereat, applied to the N-MOS section and the DRAM section at the same time, it can be applied to each in separate steps.

Figure 5:
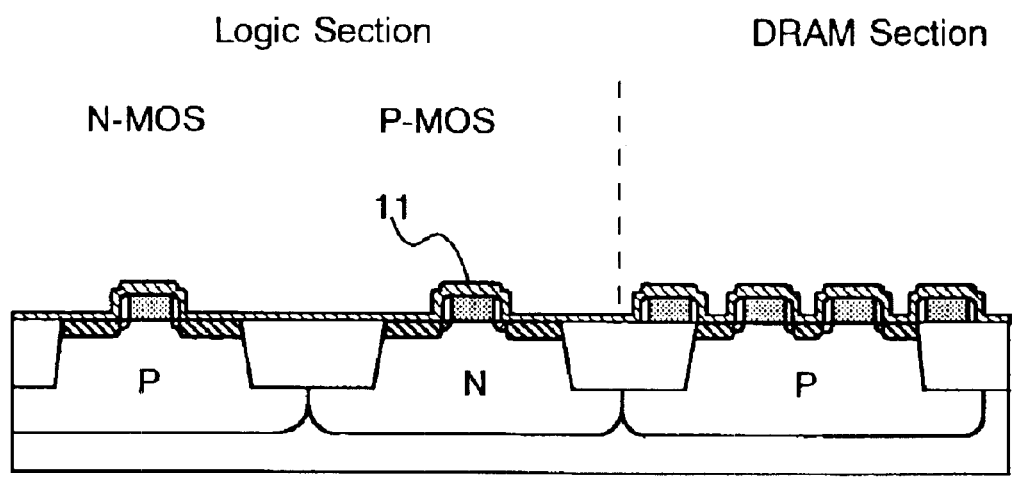

Next, as shown in FIG. 5, a metal film for silicidation is grown over the entire surface by the sputtering method or the like. Here, an example in which a cobalt (Co) film 11 is grown is shown. However, the present invention is not limited to this and any metal material that can form silicide through a thermal reaction with silicon, such as titanium and nickel, can be utilized in the same manner.

Figure 6:
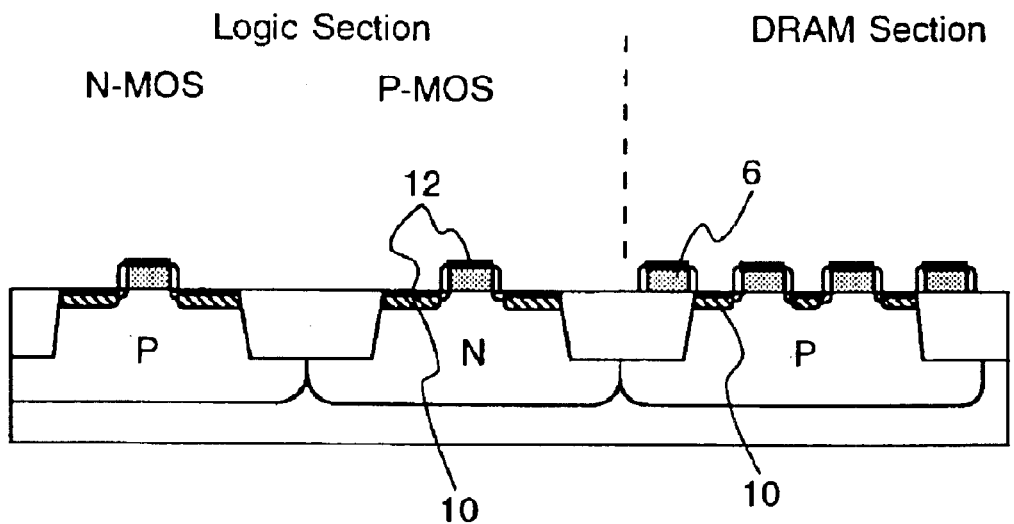

Next, the unreacted Co film 11 is removed by a heat treatment. For example, a heat treatment in $N_2$ gas atmosphere at a temperature of 500–600° C. or so is applied thereto for 30 seconds and then the unreacted Co film is removed with a mixed solution of sulfuric acid and hydrogen peroxide, and another heat treatment in the nitrogen gas atmosphere at 800° C. is further applied thereto for 10 seconds or so (the so-called salicide method), which results in formation of cobalt silicide ($CoSi_2$) 12 over all the surfaces of the S/D regions (10) and on the gate electrodes (6), as shown in FIG. 6.

Figure 7:
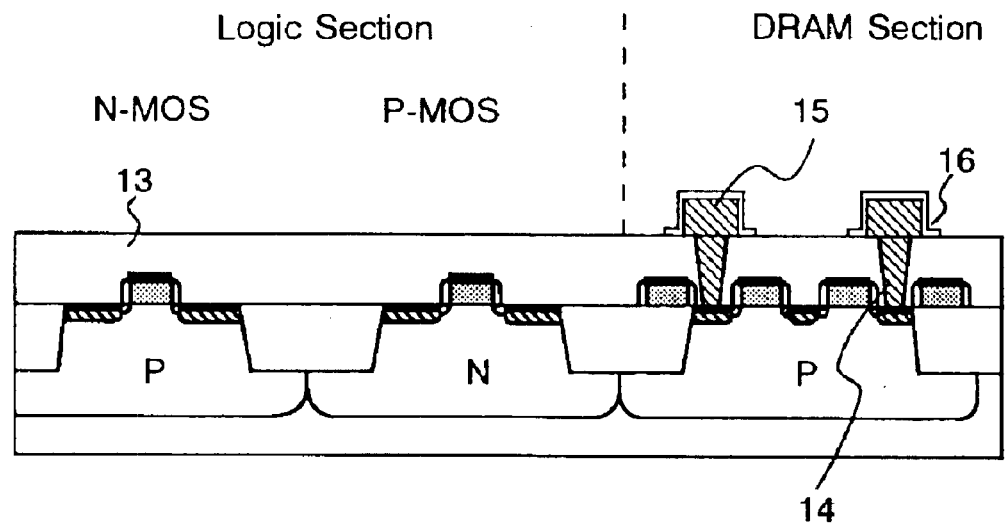

Subsequently, in the same way as the prior art, a first interlayer film 13 is formed and thereafter contact holes to connect to capacitor electrodes are formed in the DRAM section, and then, by filling up the contact holes with a metal or a polysilicon, capacitor contacts 14 are formed. Lower electrodes 15, capacitor insulating films which are omitted from the drawing and upper electrodes 16 are then formed to accomplish capacitor electrodes (FIG. 7). Although stacked-type capacitor electrodes are, herein, shown as lower electrodes, the present invention is, in no way, limited by this, and can have known cylindrical electrodes or electrodes with an even more complicated structure for them. When utilizing polysilicon, HSG (Hemispherical Silicon Grain) electrodes can be also employed. Further, the capacitor contacts, lower electrodes and upper electrodes may be formed, using a known material such as Ti/TiN/W or the like. In short, the material, the structure and such can be selected appropriately for them according to design.

Figure 8:
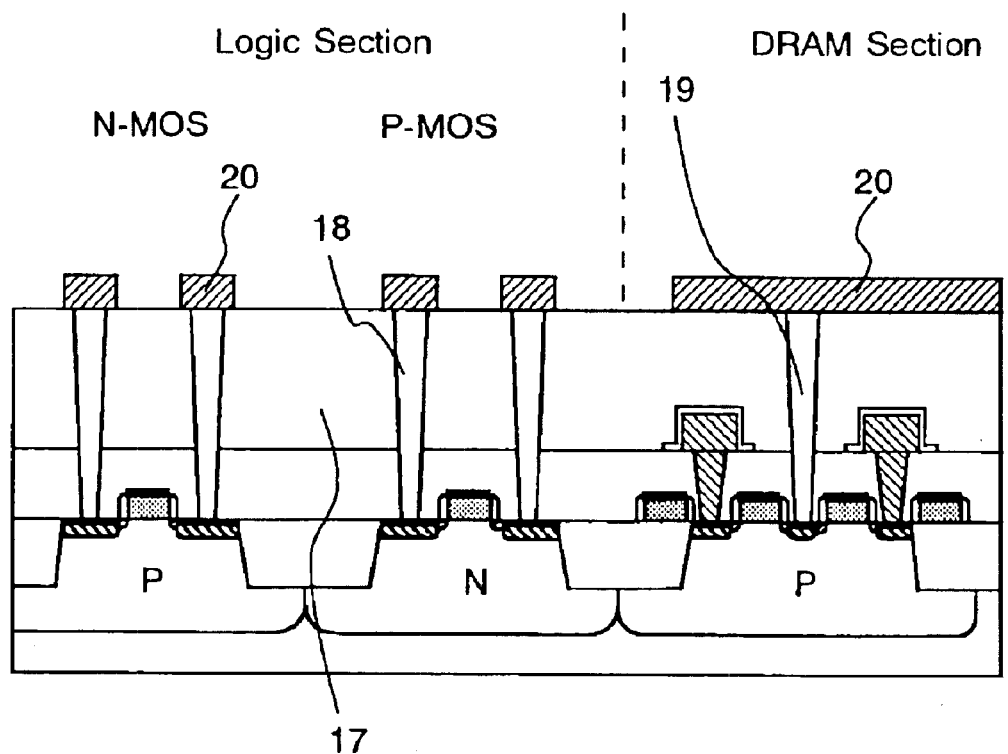
Figure 9:
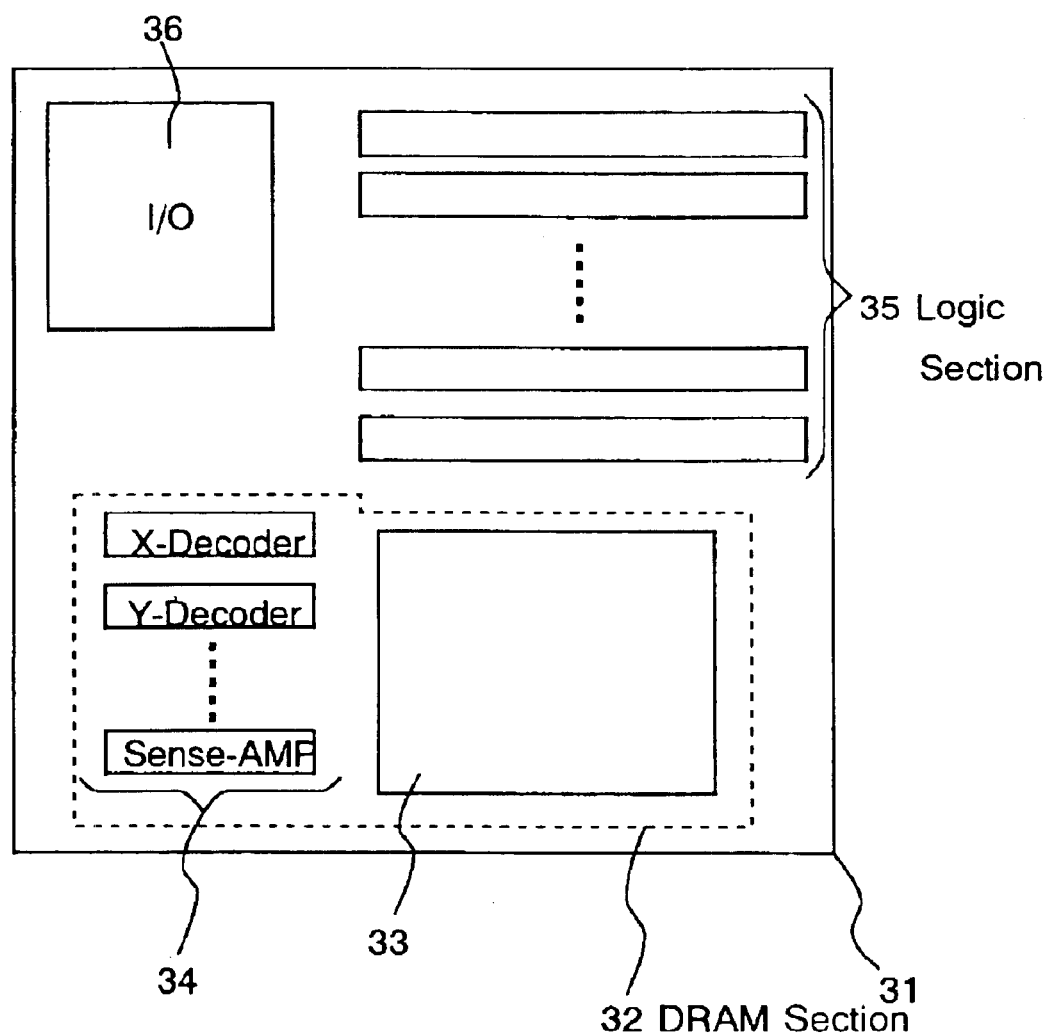
FIG. 9 is a schematic view showing an example of the structure of a SOC having a DRAM on board.
Figure 10:
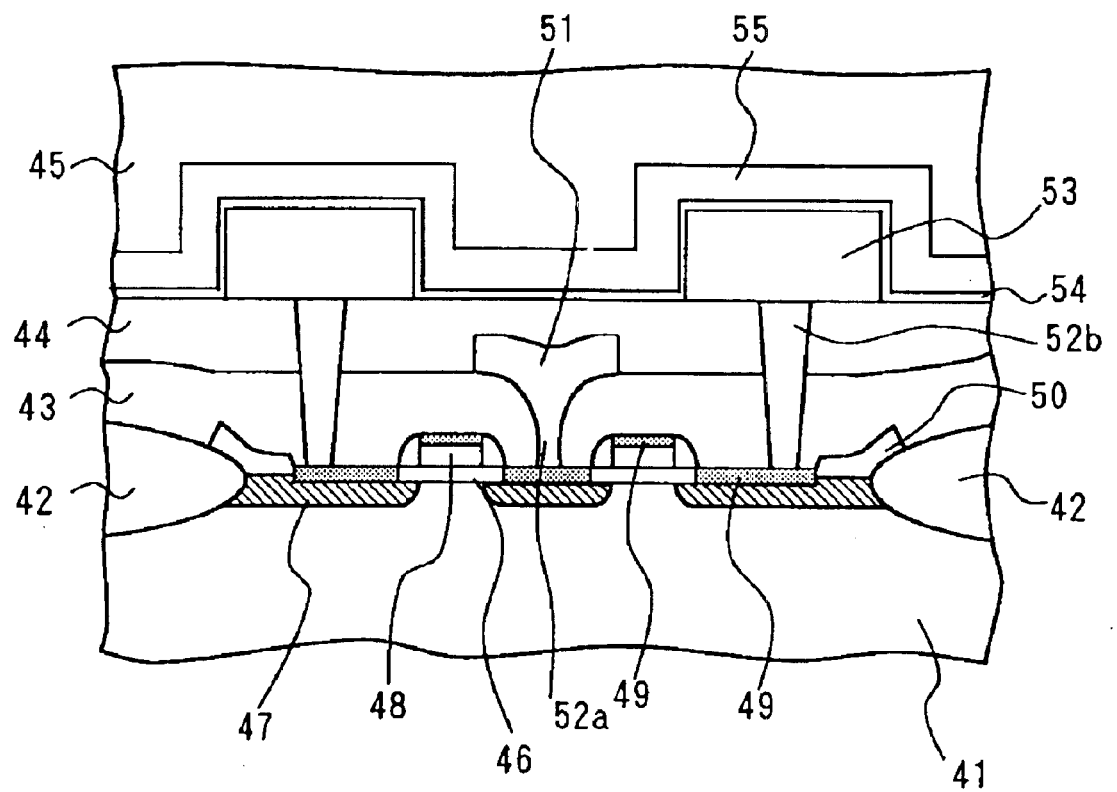
FIG. 10 is a cross-sectional view showing a conventional DRAM cell section.

Following this, as shown in FIG. 8, after a second interlayer film 17 is formed, contacts 18 each connecting with one region of the S/D regions of transistors in the logic section and a bit line contact 19 connecting with the DRAM section are formed, using a known metal material such as Ti/TiN/W or the like. Next, a known interconnection material such as Al, TiN, W or the like is grown over the entire surface by the sputtering method and then patterned, whereby a first interconnection 20 that is also to serve as a bit line is formed. Obviously, the bit line and the first interconnection can be formed as different layers or from different materials.

Further, when forming contact holes, it is preferable to form an etching stopper layer on the substrate so that the pre-formed silicide layers may not be carved into at the time of etching.

What distinguishes the present invention from the conventional techniques the most is the fact that, even in the memory cell region of the DRAM section, there are formed the S/D regions with a high dopant concentration defined as n+. When silicide is formed on the S/D regions with such a high dopant concentration, good ohmic contacts can be formed. Further, because the junction becomes deeper, the junction leakage current is hardly generated even if silicide is formed over all the surfaces of the S/D regions. In contrast with this, when silicide is formed on conventional low dopant-concentration regions (n−), Schottky contacts are formed therebetween, which is not adequate for the purpose of achieving lower resistance.

Further, by setting the S/D regions of the memory cell regions as high dopant-concentration regions, good ohmic contacts can be formed through silicidation, as described above, so that this invention can be readily put into practice. Moreover, as the present invention has a considerable effect of making the performance of the whole elements faster and the steps of a manufacturing method simpler, its technical significance cannot be overemphasized.

While, for the above description, a DRAM-incorporated SOC is given as an example, the present invention can be applied to a semiconductor device that does not have any logic section, that is, a semiconductor device having only a DRAM section. Further, the present invention can be applied to a semiconductor device having a DRAM cell section and an adjacent-circuit-functional element section, wherein silicide layers are formed over all the surfaces of the source-drain regions and the gate surfaces of transistors in the DRAM cell section and the adjacent-circuit-functional element section which comprises elements such as various decoders, sense amplifiers and the like. In this instance, too, silicidation of the DRAM cell section and the adjacent circuit section can be carried out concurrently in one and the same step, in accordance with the above description, and thereby both higher-speed performance of the whole elements and simplification of the manufacturing steps can be attained.

What is claimed is:

1. A method of manufacturing a DRAM-incorporated semiconductor device in which a DRAM section and a logic section are formed on a semiconductor substrate that is isolated into elements, said method comprising:

forming a metal film comprising one of cobalt and nickel directly on surfaces of highly doped source-drain regions and gate regions in said DRAM section and said logic section; and heat treating said device to react said metal film with said surfaces to concurrently form a metal silicide layer in each of said DRAM section and said logic section.

2. The method of manufacturing a semiconductor device according to claim 1, wherein said metal film is formed over an entire surface of said substrate, and wherein said heat treating comprises:

heating said device at 500–600° C.;

removing unreacted metal film with a mixed solution of sulfuric acid and hydrogen peroxide; and heating said device at 800° C.

3. The method of manufacturing a semiconductor device according to claim 2, wherein said metal film comprises cobalt.

4. The method of manufacturing a semiconductor device according to claim 1, wherein dopant implantation into gates are carried out concurrently with formation of the source-drain regions that constitute transistors in the DRAM section and the logic section, and thereby P-N gates are formed.

5. The method of manufacturing a semiconductor device according to claim 1, further comprising:

forming a bit contact connecting said DRAM section with a bit line and a contact plug connecting to said source-drain in said logic section, said bit contact and said contact plug comprising a metal material.

6. A method of manufacturing a DRAM-incorporated semiconductor device in which a DRAM section including a memory cell, decoder and sense amplifier, and a logic section are formed on a semiconductor substrate that is isolated into elements, said method comprising:

forming a transistor having a source including two regions different in impurity density from each other, and a drain including two regions different in impurity density from each other in said DRAM section;

forming a p-MOS transistor having a p-type gate, a source including two regions different in impurity density from each other, and a drain including two regions different in impurity density from each other in said logic section;

forming an n-MOS transistor having an n-type gate, a source including two regions different in impurity density from each other and a drain including two regions different in impurity density from each other in said logic section;

forming a metal film comprising either cobalt or nickel directly on substantially all surfaces of highly impurity-doped regions in said DRAM section and said logic section; and heating said device to react said metal film with said surfaces to concurrently form a metal silicide layer in each of said DRAM section and said logic section.

* * * * *